(12) United States Patent
Park et al.

(10) Patent No.: US 11,037,696 B2
(45) Date of Patent: Jun. 15, 2021

(54) TRANSPARENT ELECTRODES AND ELECTRONIC DEVICES INCLUDING THE SAME

(71) Applicant: SAMSUNG ELECTRONICS CO., LTD., Suwon-si (KR)

(72) Inventors: Hyeon Cheol Park, Hwaseong-si (KR); Youngjin Cho, Suwon-si (KR); Daejin Yang, Yeongju-si (KR); Chan Kwak, Yongin-si (KR); Kwanghee Kim, Seoul (KR); Weonho Shin, Seoul (KR); Yun Sung Woo, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 746 days.

(21) Appl. No.: 15/343,541

(22) Filed: Nov. 4, 2016

(65) Prior Publication Data
US 2017/0125136 A1 May 4, 2017

(30) Foreign Application Priority Data
Nov. 4, 2015 (KR) .................. 10-2015-0154781

(51) Int. Cl.
*H01B 1/22* (2006.01)
*H01B 3/44* (2006.01)
(Continued)

(52) U.S. Cl.
CPC .............. *H01B 1/22* (2013.01); *G06F 3/041* (2013.01); *H01B 3/447* (2013.01); *H01L 29/43* (2013.01);
(Continued)

(58) Field of Classification Search
CPC ...... C09D 125/18; C09J 125/18; C08L 25/18; H01B 1/22; H01B 3/447; H01L 31/022466
See application file for complete search history.

(56) References Cited

U.S. PATENT DOCUMENTS 7,265,063 B2 * 9/2007 Mardilovich ......... H01L 21/312 438/781
2008/0259262 A1 * 10/2008 Jones ................... B82Y 10/00 349/139

(Continued)

FOREIGN PATENT DOCUMENTS

JP 2014-104600 A 6/2014
JP 5691524 B2 2/2015
(Continued)

OTHER PUBLICATIONS

Allen, Photoinitiators for UV and visible curing of coatings: mechanisms and properties, Journal of Photochemistry and Photobiology A : Chemistry 100 (1996) pp. 101-107. (Year: 1996).*
(Continued)

*Primary Examiner* — Elizabeth A Robinson
(74) *Attorney, Agent, or Firm* — Cantor Colburn LLP

(57) ABSTRACT

A transparent electrode including: a first layer including a thermosetting copolymer including a first repeating unit having an aromatic moiety as a pendant group or incorporated in a backbone of the copolymer and a second repeating unit capable of lowering a curing temperature, a combination of a first polymer including the first repeating unit and a second polymer including the second repeating unit, or a combination thereof; a second layer disposed directly on one side of the first layer, wherein the second layer includes graphene; and a third layer disposed on the second layer, wherein the third layer includes an electrically conductive metal nanowire.

12 Claims, 11 Drawing Sheets

(51) Int. Cl.
*H01L 31/0224* (2006.01)
*H01L 29/43* (2006.01)
*G06F 3/041* (2006.01)
*H01L 51/44* (2006.01)
*H01L 51/00* (2006.01)

(52) U.S. Cl.
CPC .... *H01L 31/022466* (2013.01); *H01L 51/003* (2013.01); *H01L 51/0021* (2013.01); *H01L 51/0097* (2013.01); *H01L 51/442* (2013.01); *G06F 2203/04103* (2013.01); *H01L 51/0045* (2013.01)

(56) References Cited

U.S. PATENT DOCUMENTS

| | | |
|---|---|---|
| 2011/0216020 A1 | 9/2011 | Lee et al. |
| 2012/0261167 A1 | 10/2012 | Sung |
| 2013/0264009 A1 | 10/2013 | Kimura et al. |
| 2014/0146490 A1 | 5/2014 | Bando et al. |
| 2014/0335312 A1 | 11/2014 | Suh et al. |

FOREIGN PATENT DOCUMENTS

| | | |
|---|---|---|
| KR | 1148450 B1 | 5/2012 |
| KR | 1479811 B1 | 12/2014 |

OTHER PUBLICATIONS

Mi-Sun Lee et al. "High-Performance, Transparent, and Stretchable Electrodes Using Graphene-Metal Nanowire Hybrid Structures", Nano Lett. 2013, 13, 2814-2821.

\* cited by examiner

FIG. 3A

| Window |
|---|
| Second optically clear adhesive layer |
| Second transparent conductive film |
| First optically clear adhesive layer |
| First transparent conductive film |
| Display panel |

TRANSPARENT ELECTRODES AND ELECTRONIC DEVICES INCLUDING THE SAME

CROSS-REFERENCE TO RELATED APPLICATION

This application claims priority to Korean Patent Application No. 10-2015-0154781 filed in the Korean Intellectual Property Office on Nov. 4, 2015, and all the benefits accruing therefrom under 35 U.S.C. § 119, the content of which is incorporated herein in its entirety by reference.

BACKGROUND

1. Field

A transparent electrode and an electronic device including the same are disclosed.

2. Description of the Related Art

An electronic device, such as a flat panel display (for example, an LCD or LED display), a touch screen panel, a solar cell, a transparent transistor, and the like includes a transparent electrode. It is desirable for a material for a transparent electrode to have high light transmittance (e.g., greater than or equal to about 80% in a visible light region) and low specific resistance (e.g., less than or equal to about $1 \times 10^{-4}$ ohm-centimeters, $\Omega \cdot cm$). Currently available oxide materials include indium tin oxide (ITO), tin oxide ($SnO_2$), zinc oxide (ZnO), and the like. ITO is a transparent electrode material and is a transparent semiconductor having a wide bandgap of 3.75 electron Volts (eV), which may be manufactured in a large area using a sputtering process. However, for application in a flexible touch panel, or a UD-grade high resolution display, ITO has poor flexibility and will inevitably have high cost due to limited reserves of indium. Therefore, numerous attempts have been made to replace ITO with alternative materials.

Recently, a flexible electronic device, e.g., a foldable or bendable electronic device, has drawn much interest as a next generation electronic device. Therefore, there is a need for a material having improved transparency, relatively high electrical conductivity, and suitable flexibility, as well as for transparent electrode materials.

SUMMARY

An embodiment provides a flexible electrical conductor having improved conductivity and improved light transmittance.

Another embodiment provides a method of manufacturing the transparent electrode.

Yet another embodiment provides an electronic device including the transparent electrode.

In an embodiment, a transparent electrode includes:
a first layer including:
a thermosetting copolymer including a first repeating unit having an aromatic moiety as a pendant group or incorporated in a backbone of the copolymer and a second repeating unit capable of lowering a curing temperature of the copolymer,
a combination of a first polymer including the first repeating unit and a second polymer including the second repeating unit, or
a combination thereof;
a second layer disposed directly on a first side of the first layer, wherein the second layer includes graphene; and
a third layer disposed on the second layer, wherein the third layer includes an electrically conductive metal nanowire.

The transparent electrode may include a polymer substrate that is disposed on a second side opposite the first side of the first layer.

The thermosetting copolymer may include a first repeating unit represented by Chemical Formula 1 and second repeating unit represented by Chemical Formula 2:

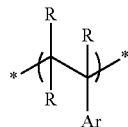

Chemical Formula 1 wherein in Chemical Formula 1,
each R is independently hydrogen, a substituted or unsubstituted C1 to C10 alkyl group, a hydroxyl group, a carboxylic acid group, a carboxylate group, an amine group, an aldehyde group, or a substituted or unsubstituted C2 to C11 alkoxycarbonyl group, and
Ar is a C6 to C40 aryl group or a C6 to C40 aryl group substituted with a hydroxyl group or an amine group, and

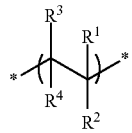

Chemical Formula 2 wherein in Chemical Formula 2,
$R^1$, $R^2$, $R^3$, and $R^4$ are each independently hydrogen, a substituted or unsubstituted C1 to C10 alkyl group, or a substituted or unsubstituted C2 to C11 alkoxycarbonyl group.

In Chemical Formula 2, one of $R^1$, $R^2$, $R^3$, and $R^4$ is a C2 to C11 alkoxycarbonyl group.

The first layer may include a copolymer represented by Chemical Formula 3:

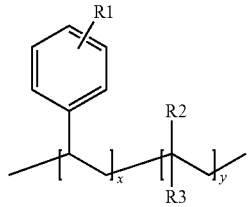

Chemical Formula 3 wherein in Chemical Formula 3,
R1 is a hydroxyl group or an amine group,
R2 is hydrogen or a C1 to C3 alkyl,
R3 is —COOR$_4$, wherein R$_4$ is a substituted or unsubstituted C1 to C10 alkyl group,
x represents the number of the first repeating units, and
y represents the number of the second repeating units.

The copolymer may include a polystyrene-polyalkyl (meth)acrylate copolymer, a polyvinyl phenol-polyalkyl (meth)acrylate copolymer, or a combination thereof, wherein "alkyl" in the polystyrene-polyalkyl(meth)acrylate copolymer and the polyvinyl phenol-polyalkyl(meth)acrylate copolymer is a substituted or unsubstituted C1 to 010 alkyl group.

The first polymer may be polyvinyl phenol, and the second polymer may be a polymethyl(meth)acrylate.

A thickness of the first layer may be less than or equal to about 300 nanometers.

A thickness of the first layer may be about 50 nanometers to about 200 nanometers.

The first layer may further include a zinc-containing compound, a tin-containing compound, a gold-containing compound, an aryl amine, an arylimidazole, a curing agent, a nitric acid, or a combination thereof.

The electrically conductive metal may include silver, copper, gold, aluminum, cobalt, palladium, or a combination thereof.

An average diameter of the electrically conductive metal nanowire may be less than or equal to about 50 nanometers.

An average length of the electrically conductive metal nanowire may be greater than or equal to 1 micrometer.

The transparent electrode may further include an overcoating layer including a polymer disposed on the third layer.

The transparent electrode may have light transmittance of greater than or equal to about 85% at a wavelength of 550 nanometers and sheet resistance of less than or equal to about 200 ohms per square.

In another embodiment, a method of manufacturing the transparent electrode includes:

providing a first layer including a thermosetting copolymer including a first repeating unit having an aromatic moiety as a pendant group or incorporated in a backbone of the copolymer and a second repeating unit capable of lowering a curing temperature, a combination of a first polymer including the first repeating unit and a second polymer including the second repeating unit, or a combination thereof, disposed on a substrate;

forming a second layer including graphene disposed on a release film;

contacting the second layer with the first layer and curing the contacted first and second layers to provide a laminate structure;

removing the release film from the second layer of the laminate structure to expose the surface of the second layer; and forming a third layer including an electrically conductive metal nanowire on the surface of the exposed second layer.

The thermosetting copolymer may include a first repeating unit represented by Chemical Formula 1 and a second repeating unit represented by Chemical Formula 2:

Chemical Formula 1

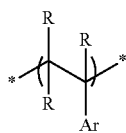

wherein in Chemical Formula 1, each R is independently hydrogen, a substituted or unsubstituted C1 to C10 alkyl group, a hydroxyl group, a carboxylic acid group, a carboxylate group, an amine group, an aldehyde group, or a substituted or unsubstituted C2 to C11 alkoxycarbonyl group, and Ar is a C6 to C40 aryl group or a C6 to C40 aryl group substituted with a hydroxyl group or an amine group; and Chemical Formula 2

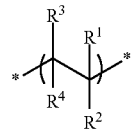

wherein Chemical Formula 2, $R^1$, $R^2$, $R^3$, and $R^4$ are each independently hydrogen, a substituted or unsubstituted C1 to C10 alkyl group, or a substituted or unsubstituted C2 to C11 alkoxycarbonyl group.

The forming the first layer may include coating on the substrate a polymer solution including the thermosetting copolymer, the combination of the first/second polymer, or a combination thereof. In the polymer solution, an amount of the thermosetting copolymer and/or the combination of the first/second polymer may be about 0.05 to about 20 percent by weight based on the total weight of the polymer solution.

The polymer solution may further include a curing agent, a zinc-containing compound, a tin-containing compound, an aryl imidazole, an aryl amine, a gold-containing compound, a nitric acid, or a combination thereof.

In another embodiment, an electronic device may include the transparent electrode.

The electronic device may be a flat panel display, a touch screen panel, a solar cell, an e-window, an electrochromic mirror, a heat mirror, a transparent transistor, or a flexible display.

According to an embodiment, provided is a transparent electrode having a lower sheet resistance and a higher light transmittance together with flexibility.

BRIEF DESCRIPTION OF THE DRAWINGS

The above and other advantages and features of this disclosure will become more apparent by describing exemplary embodiments thereof in further detail with reference to the accompanying drawings, in which:

FIG. 3A is a schematic view showing a cross-section of an electronic device (touch screen panel) according to an embodiment;

DETAILED DESCRIPTION

Figure 1:
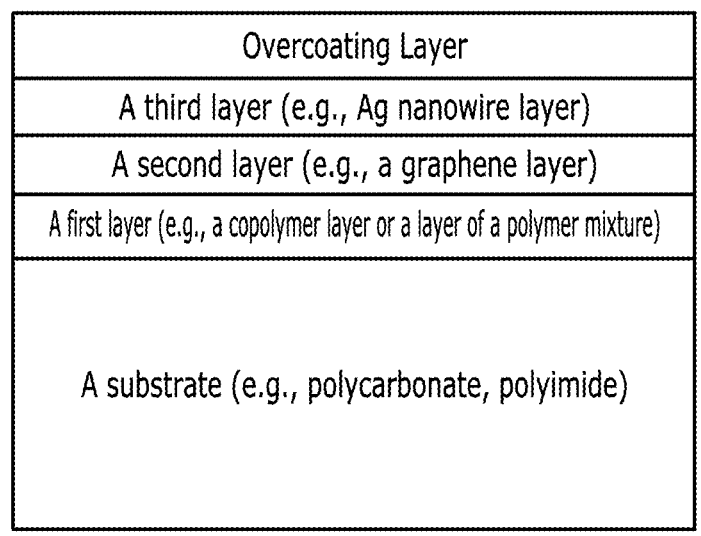
FIG. 1 is a schematic view showing a cross-section of a transparent electrode according to an embodiment.

This disclosure will be described more fully hereinafter in the following detailed description, in which some but not all embodiments of this disclosure are described with reference to the attached drawings. This disclosure may be embodied in many different forms and is not be construed as limited to the embodiments set forth herein. Unless otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted. In addition, unless explicitly described to the contrary, the word "comprise" and variations such as "comprises" or "comprising", will be understood to imply the inclusion of stated elements but not the exclusion of any other elements.

Exemplary embodiments are described herein with reference to illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Unless specifically described to the contrary, a singular form includes a plural form.

In the drawings, the thickness of layers, regions, etc., are exaggerated for clarity. Like reference numerals designate like elements throughout the specification.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. Unless specified otherwise, the term "or" means "and/or." As used herein, the term "and/or" includes any and all combinations of one or more of the associated items. Expressions such as "at least one of," when preceding a list of elements, modify the entire list of elements and do not modify the individual elements of the list.

It will be understood that when a first element is referred to as being "on" a second element, it may be directly on the other element or intervening elements may also be present. In contrast, when an element is referred to as being "directly on" another element, there are no intervening elements present.

In the specification, the sheet resistance refers to a value defined by the 4-point probe measurement for the specimen having a predetermined size (e.g., a width of 8 cm and a length of 8 cm).

As used herein, the term transmittance may include light absorbance of a substrate. For example, when a PET substrate is used, light transmittance of the PET substrate itself is about 92.5%.

As used herein, the (meth)acrylate refers to acrylate or methacrylate.

As used herein, the term "alkyl group" refers to a straight or branched chain saturated aliphatic hydrocarbon group having the specified number of carbon atoms and having a valence of at least one.

As used herein, the term "alkoxycarbonyl group" refers to the group "alkyl-O—C(=O)—", wherein "alkyl" is the same as defined above.

As used herein, the term "aryl group", which is used alone or in combination, refers to an aromatic hydrocarbon containing at least one ring and having the specified number of carbon atoms. The term "aryl" may be construed as including a group with an aromatic ring fused to at least one cycloalkyl ring.

As used herein, the term "halogen" refers to fluorine, chlorine, bromine, or iodine.

As used herein, the term "halogenated" refers to a group containing at least one halogen atom.

As used herein, the term "non-halogenated" refers to a group containing no halogen atoms.

As used herein, the term "hydroxyl group" refers to the group "—OH". As used herein, the term "carboxylic acid group" refers to the group "—CO$_2$H".

As used herein, the term "carboxylate group" refers to the group "—CO$_2$M", wherein M is an organic or inorganic cation.

As used herein, the term "amine group" refers to the group "—NR$_2$", wherein each R is independently hydrogen, a C1 to C6 alkyl group, or a C6 to C12 aryl group.

As used herein, the term "aldehyde group" refers to the group "—CHO".

As used herein, when specific definition is not otherwise provided, the term "substituted" refers to a group or atom substituted with a substituent selected from a halogen atom (F—, Cl—, Br—, and I—), a hydroxyl group, an alkoxy group, a nitro group, a cyano group, an amino group, an azido group, an amidino group, a hydrazino group, a hydrazono group, a carbonyl group, a carbamoyl group, a thiol group, a C2 to C10 ester group, a carboxylic acid group, or a salt thereof, a sulfonic acid group or a salt thereof, a phosphoric acid or a salt thereof, a 01 to C20 alkyl group, a C2 to C20 alkenyl group, a C2 to C20 alkynyl group, a C6 to C30 aryl group, a C7 to C30 arylalkyl group, a 01 to C30 alkoxy group, a 01 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof, instead of hydrogen of a compound or a functional group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent.

For example, when the term "substituted C1-C10 alkyl" refers to a C1-C10 alkyl group substituted with a C6-C30 aryl group, the total number of carbon atoms in the resulting aryl substituted alkyl group is C7-C40. In another example, when the term "substituted C2-C11 alkoxycarbonyl" refers to a C2-C11 alkoxycarbonyl group substituted with a C6-C30 aryl group, the total number of carbon atoms in the resulting aryl substituted alkoxycarbonyl group is C8-C41.

As used herein, the term "combination thereof" refers to a mixture, a stacked structure, a composite, an alloy, a blend, a reaction product, or the like.

In an embodiment, a transparent electrode is a hybrid structure including:

a first layer including a thermosetting copolymer, a second layer disposed directly on one side (a first side) of the first layer, wherein the second layer includes graphene or a derivative thereof, and a third layer disposed on the second layer, wherein the third layer includes an electrically conductive metal nanowire (referring to FIG. 1).

The transparent electrode may include a transparent substrate disposed on the other side of the first layer, i.e., a second side opposite the first side of the first layer. The transparent substrate may be a plastic, i.e., a polymer substrate. The transparent substrate may be flexible. The transparent electrode may further include an overcoating layer (e.g., protecting the electrically conductive metal nanowire) disposed on the third layer including the electrically conductive metal nanowire.

The substrate may be a transparent substrate. A material of the substrate is not particularly limited, and may be a glass substrate, a semiconductor substrate, a polymer substrate, or a combination thereof or may be a substrate including an insulation layer and/or a conductive layer laminated thereon. In a non-limiting example, the substrate may include an inorganic material such as oxide glass and glass, polyester such as polyethylene terephthalate, polybutylene terephthalate, and polyethylene naphthalate, polycarbonate, an acryl-based polymer such as polymethyl methacrylate, a cellulose, or a derivative thereof, a polymer such as polyimide, or an organic/inorganic hybrid material, or a combination thereof. The thickness of the substrate is not particularly limited and may be appropriately selected depending on a type of a final product. For example, the thickness of the substrate may be greater than or equal to about 10 micrometers (μm), for example, greater than or equal to about 50 μm, or greater than or equal to about 75 μm, but is not limited thereto. Generally, the polymer substrate may have a thickness of about 50 to about 100 μm, for example, about 60 to about 80 μm, but is not limited thereto. The thickness of the substrate may be less than or equal to about 2 millimeters (mm), for example, less than or equal to about 500 μm, or less than or equal to about 200 μm, but is not limited thereto.

The transparent electrode includes:

a first layer including:

a thermosetting copolymer including a first repeating unit having an aromatic moiety as a pendant group or incorporated in a backbone of the copolymer and a second repeating unit capable of lowering a curing temperature, a combination of a first polymer including the first repeating unit and a second polymer including the second repeating unit, or a combination thereof, a second layer disposed directly on one side of the first layer, wherein the second layer includes graphene or a derivative thereof; and a third layer disposed on the second layer, wherein the third layer includes an electrically conductive metal nanowire.

The first layer may perform a function of improving the binding force of the second layer.

If desired, an overcoating layer (OCL) including the thermosetting copolymer, the combination of the first polymer and the second polymer, or both may be provided directly on the second layer.

If desired, an overcoating layer (OCL) including at least one selected from a polymer such as urethane acrylate or perfluoropolyether; the thermosetting copolymer; and the combination of the first polymer and the second polymer may be provided on the third layer, in order to protect an electrically conductive metal nanowire (e.g., silver (Ag) nanowire).

Thereby, the transparent electrode according to an embodiment may possess a hybrid structure having a third layer including an electrically conductive metal nanowire and a second layer including graphene.

Various research efforts have been undertaken to develop a flexible transparent electrode material having high electrical conductivity and transparency in the visible ray region. In this regard, a metal may have high electron density and high electrical conductivity. However, the metal tends to react with oxygen in air to provide an oxide on the surface of the metal, and thus the conductivity of the metal may be significantly decreased. Attempts also have been made to decrease surface contact resistance by using a ceramic material that shows good conductivity and a reduced level of surface oxidation. However, the currently available conductive ceramic material (e.g., ITO) is not always available. In addition, ITO has difficulties in accomplishing a metal-level conductivity, and insufficient flexibility. Research efforts on application of graphene as a highly flexible transparent conductive film material capable of replacing the indium tin oxide (ITO) having insufficient mechanical characteristics have been undertaken, due to its good conductive characteristics. However, graphene does not possess satisfactory transmittance due to a high absorption coefficient (a), and rarely has thickness of greater than or equal to about four sheets of monoatomic layers. Meanwhile, although the flexible transparent electrodes using nanowire of an electrically conductive metal (e.g., gold, silver, or the like) have been also developed, the electrically conductive metal nanowire cannot be readily applied in a flexible electrode since nanowire is broken in a high elongation region due to the low feature elongation (e.g., less than or equal to about 4%).

In other words, although the electrically conductive metal nanowire (e.g., Ag nanowire) may show a low sheet resistance and improved transmittance, breakage of the wire may easily occur at a high strain region (e.g., greater than or equal to about 6.7%). Graphene may provide improved flexibility, but its sheet resistance at a predetermined transmittance is high.

The transparent electrode according to an embodiment has a hybrid structure in which a third layer including an electrically conductive metal nanowire is disposed on the second layer including graphene. By the hybrid structure, the transparent electrode according to an embodiment may have a decreased sheet resistance, and may also show enhanced flexibility as the electric conductive path provided by graphene is present even in a region including broken electrically conductive metal nanowires (Ag NW).

The transparent electrode according to an embodiment may have a resistance change rate after bending that is significantly lower than the electrode including nanowire only. For example, the transparent electrode may show a resistance change rate (ΔR/R) of less than or equal to about 60, for example, less than or equal to about 50%, less than or equal to about 40%, or less than or equal to about 30% after bending at a curvature radius of 1 millimeter (mm) (1R, strain: 4-7%) for 200,000 times.

Meanwhile, graphene has poor adherence to most types of substrates due to its good chemical stability, and thus using the same as a transparent electrode material has been very limited so far. For example, graphene binds weakly to flexible substrates, so performance of the electrode is easily deteriorated when it is used in a process or when it is mechanically impacted. In addition, even when the electrode is subjected to a mild taping test, a layer including graphene peels off easily. As a result, application of graphene in a hybrid structure has been very limited.

The transparent electrode according to an embodiment may have remarkably improved binding properties by disposing the second layer including graphene directly on the first layer including a copolymer including a first repeating unit having an aromatic moiety as a pendant group or incorporated in a backbone of the copolymer and a second repeating unit capable of lowering a curing temperature, a combination of a first polymer including the first repeating unit and a second polymer including the second repeating unit, or a combination thereof (e.g., a combination of the copolymer and the first/second polymer). Without wishing to be bound by any theory, it is believed that the binding force between the first layer and the second layer may be improved by π-π stacking between the aromatic moiety present in the copolymer and graphene.

The first repeating unit may be a polystyrene moiety, a polyvinyl phenol moiety, a polyphenylene ether moiety, a polyphenylene sulfide moiety, or a combination thereof.

In an embodiment, the first repeating unit may be represented by Chemical Formula 1:

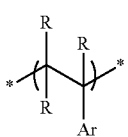

Chemical Formula 1]

wherein in Chemical Formula 1,
each R is independently hydrogen, a substituted or unsubstituted C1 to C10 alkyl group, a hydroxyl group, a carboxylic acid group, a carboxylate group, an amine group, or a substituted or unsubstituted C2 to C11 alkoxycarbonyl group such as methoxycarbonyl (methyl ester) or ethoxycarbonyl (ethyl ester), and Ar is a C6 to C40 aryl group or a C6 to C40 aryl group substituted with a hydroxyl group or an amine group. The C6 to C40 aryl group may include a halogenated or non-halogenated C6 to C40 aryl group. The C6 to C40 aryl group substituted with a hydroxyl group or an amine group may include a halogenated or non-halogenated C6 to C40 aryl group substituted with a hydroxyl group or an amine group. The aryl group may be a benzyl group, a naphthyl group, a hydroxyphenyl group, or an aminophenyl group.

The second repeating unit may be a polyalkyl(meth)acrylate moiety (wherein "alkyl" refers to a substituted or unsubstituted C1 to C10 alkyl group), a polyethylene moiety, or a combination thereof.

The second repeating unit may be represented by Chemical Formula 2:

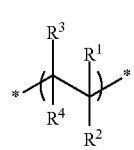

Chemical Formula 2 wherein in Chemical Formula 2,
R¹, R², R³, R⁴ are each independently hydrogen, a substituted or unsubstituted C1 to C10 alkyl group (a methyl group, an ethyl group, a propyl group, etc.), or a substituted or unsubstituted C2 to C11 alkoxycarbonyl group.

In Chemical Formula 2, one of R¹, R², R³ and R⁴ may be a substituted or unsubstituted C2 to C11 alkoxycarbonyl group (R(O=O)O—, wherein R is a substituted or unsubstituted C1 to C10 alkyl group).

The first layer may include a thermosetting copolymer represented by Chemical Formula 3:

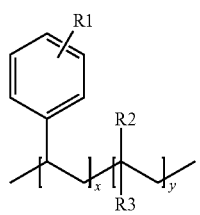

Chemical Formula 3 wherein in Chemical Formula 3,
R1 is a hydroxyl group or an amine group,
R2 is hydrogen or a C1 to C3 alkyl,
R3 is —COOR₄, wherein R₄ is a substituted or unsubstituted C1 to C10 alkyl group,
x represents the number of the first repeating units, and
y represents the number of the second repeating units.

The copolymer may include a polystyrene-polyalkyl (meth)acrylate copolymer, a polyvinyl phenol-polyalkyl (meth)acrylate copolymer, or a combination thereof, wherein "alkyl" in the polystyrene-polyalkyl(meth)acrylate copolymer and the polyvinyl phenol-polyalkyl(meth)acrylate copolymer is a substituted or unsubstituted C1 to C10 alkyl group. The copolymer may be a block copolymer, a random copolymer, or an alternate copolymer.

In the copolymer, a mole ratio of the first repeating unit and the second repeating unit (the first repeating unit:the second repeating unit) may be about 1:10 to about 1:0.01, for example, about 1:5 to about 1:0.2, about 1:4 to about 1:0.25, about 1:3 to about 1:0.3, about 1:2 to about 1:0.5, or about 1:1.25 to about 1:0.75, but is not limited thereto.

A molecular weight of the copolymer may be appropriately selected, but is not particularly limited. For example, a weight average molecular weight of the copolymer may be greater than or equal to about 1,000 Daltons (Da), for example, greater than or equal to about 2,000 Da. For example, the weight average molecular weight of the copolymer may be less than or equal to about 50,000 Da, for example, less than or equal to about 20,000 Da. For example, the weight average molecular weight of the copolymer may be about 3,000 Da to about 15,000 Da.

The first polymer including the first repeating unit may be polystyrene, polyvinyl phenol, or a combination thereof. The second polymer including the second repeating unit may include polymethyl methacrylate, polymethyl acrylate, polyethyl acrylate, polyethyl methacrylate, polyurethane acrylate, polyurethane methacrylate, or a combination thereof.

A molecular weight of the first polymer is not particularly limited, and may be appropriately selected. For example, the molecular weight of the first polymer may be a weight average molecular weight of greater than or equal to about 1,000 Da, for example, greater than or equal to about 2,000 Da. The molecular weight of the first polymer may be a weight average molecular weight of less than or equal to about 50,000 Da, for example, less than or equal to about 20,000 Da. A molecular weight of the second polymer is not particularly limited, and may be appropriately selected. For example, the molecular weight of the second polymer may be a weight average molecular weight of greater than or equal to about 1,000 Da, for example, greater than or equal to about 2,000 Da. A molecular weight of the second polymer may be a weight average molecular weight of less than or equal to about 50,000 Da, for example, less than or equal to about 20,000 Da.

A mixing ratio of the first polymer and the second polymer is not particularly limited, and may be appropriately selected. For example, a mole ratio of the first polymer and the second polymer may be about 1:10 to about 1:0.01, for example, about 1:5 to about 1:0.2, about 1:4 to about 1:0.25, about 1:3 to about 1:0.3, about 1:2 to about 1:0.5, or about 1:1.25 to about 1:0.75, and is not limited thereto.

Because most types of a transparent organic substrate have a low Tg (glass transition temperature), it is desirable to perform a process at a temperature of less than or equal to about 180° C. The copolymer or the combination of the first and second polymers has the first repeating unit and the second repeating unit together, and thus may be cured in a low amount or in the absence of a curing agent at a lower temperature. Thus, enhanced adherence may be ensured even when the first layer has low thickness. Therefore, a thickness of the first layer may be less than or equal to about 500 nanometers (nm), for example, less than or equal to about 450 nm, less than or equal to about 400 nm, less than or equal to about 350 nm, less than or equal to about 300 nm, less than or equal to about 250 nm, less than or equal to about 200 nm, less than or equal to about 150 nm, less than or equal to about 140 nm, less than or equal to about 130 nm, or less than or equal to about 120 nm.

The curing agent capable of being used together with the copolymer or the polymer combination is not particularly limited and may be determined according to the kind of polymer. For example, the curing agent may be a radical polymerizable curing agent produced by heat or light. For example, the curing agent may be melamine formaldehyde, poly(melamine-formaldehyde), or a combination thereof, but is not limited thereto. The content of the curing agent is not particularly limited, and may be appropriately selected according to the content of the copolymer. For example, the curing agent may be included in 0 part by weight to about 3.5 parts by weight based on 100 parts by weight of the copolymer, but is not limited thereto.

In addition to the curing agent, the copolymer solution may further include an initiator for initiating a polymerization reaction, i.e., a reaction initiator. The reaction initiator may be, for example, a thermal initiator or a photoinitiator such as a free radical photoinitiator or an ionic photoinitiator. A thermal initiator can be an azo compound such as 4,4-azobis(4-cyanovaleric acid), 1,1'-azobis(cyclohexanecarbonitrile), or 2,2'-azobisisobutyronitrile (AIBN); an inorganic peroxide such as ammonium persulfate, hydroxymethanesulfinic acid monosodium salt dehydrate, and sodium or potassium persulfate; and an organic peroxide such as benzoyl peroxide, 2,2-bis(tert-butylperoxy)butane, 1,1-bis(tert-butylperoxy)cyclohexane, 2,5-bis(tert-butylperoxy)-2,5-dimethylhexane, 2,5-bis(tert-butylperoxy)-2,5-dimethyl-3-hexyne, bis(1-(tert-butylperoxy)-1-methylethyl) benzene, 1,1-bis(tert-butylperoxy)-3,3,5-trimethylcyclohexane, tert-butyl hydroperoxide, tert-butyl peracetate, tert-butyl peroxide, tert-butyl peroxybenzoate, tert-butylperoxy isopropyl carbonate, cumene hydroperoxide, cyclohexanone peroxide, dicumyl peroxide, lauroyl peroxide, 2,4-pentanedione peroxide, and peracetic acid, but is not limited thereto. A photoinitiator can be benzoin and its derivatives such as benzoin ethyl ether, benzoin isobutyl ether, or benzoin methyl ether; a benzyl ketal; acetophenone and its derivatives such as 2,2-diethoxyacetophenone, 2,2-dimethoxy-2-phenylacetophenone, 4'-ethoxyacetophenone, 3'-hydroxyacetophenone, 4'-hydroxyacetophenone; benzophenone and its derivatives such as 3-hydroxybenzophenone, 4-hydroxybenzophenone, 4'-phenoxyacetophenone; an acylphosphine oxide, such as diphenyl(2,4,6-trimethylbenzoyl)phosphine oxide, but are not limited thereto.

The initiator may include a peroxide compound such as benzoyl peroxide, an azo compound such as AIBN, and the like, but is not limited thereto.

The copolymer solution may further include a curing agent, a zinc-containing compound (e.g., a zinc salt, for example, a zinc organic salt such as zinc acetate or a zinc inorganic salt, for example, zinc nitrate), a tin-containing compound (e.g., a tin salt, for example, a tin organic salt such as tin acetate or a tin inorganic salt, for example, tin nitrate), an aryl (or benzyl) imidazole, an aryl (or benzyl) amine, a gold (Au)-containing compound (e.g., a gold salt, for example, a gold organic salt such as gold acetate or a gold inorganic salt), nitric acid, or a combination thereof. According to an embodiment, when a metal salt such as a zinc salt, a tin salt, or a gold salt is included, it acts as n- or p-type dopant of graphene, so as to provide an improved electrical conductivity (i.e., lower sheet resistance) of graphene.

The first layer may be formed by coating a solution in which the copolymer, the Zn-, Sn-, or Au-containing metal salt, the imidazole, the amine, or selectively, a curing agent is dissolved into an organic solvent on the substrate and drying the coated composition. The nature of the organic solvent is not particularly limited, but may include any solvents which are capable of dissolving a copolymer or the like. In an embodiment, the solvent may include propylene glycol monomethyl ether acetate (PEGMEA), diacetone alcohol (DAA), isopropyl alcohol (IPA), or a combination thereof. When a mixed solvent of diacetone alcohol and isopropyl alcohol is used, the wetting property with a PET substrate may be improved, and thus the binding force after the curing may be improved, and the light characteristics may also be enhanced. In addition, when the mixed solvent of DAA and IPA is used, the resistance change rate may be further decreased.

The solid content (e.g., the amount of non-volatile components) in the solution for a first layer may be appropriately selected after taking into consideration a coating method, a desired thickness of the first layer, and the like. For example, the solid content in the solution for a first layer may be greater than or equal to about 0.05 percent by weight (wt %), greater than or equal to about 0.1 wt %, greater than or equal to about 1 wt %, or greater than or equal to about 1.5 wt %, but is not limited thereto. The solid content in the solution for a first layer may be less than or equal to about 20 wt %, less than or equal to about 18 wt %, less than or equal to about 15 wt %, less than or equal to about 10 wt %, less than or equal to about 9 wt %, less than or equal to about 8 wt %, less than or equal to about 7 wt %, less than or equal to about 6 wt %, or less than or equal to about or 5 wt %, but is not limited thereto.

A second layer including graphene or a derivative thereof (e.g., a graphene derivative such as graphene oxide—hereinafter, the term 'graphene' is used to include graphene or any derivative thereof) is disposed directly on the first layer.

According to a non-limiting embodiment, the composition including a nanosheet of a graphene derivative such as graphene oxide is coated on the first layer to provide a graphene layer.

In another non-limiting embodiment, the second layer including graphene may be obtained by growing a graphene layer on a metal substrate; attaching a release film thereto; performing a metal etching to provide a laminate structure of release film-graphene; binding the graphene surface of the obtained laminate structure and the first layer; and curing the same.

In addition, the method without performing a metal etching includes: stacking a graphene layer on a thermal release adhesive tape and pressing the same to bind them. When the graphene layer is attached on the substrate formed with the first layer and then heated, the tape is delaminated to provide a graphene layer on the first layer.

The metal substrate may include at least one metal or an alloy selected from Cu, Ni, Co, Fe, Pt, Au, Ru, Al, Cr, Mg, Mn, Mo, Rh, Si, Ta, Ti, W, U, V, Zr, brass, bronze, white brass, stainless steel, and Ge. The graphene layer on the metal substrate is formed by a thermal decomposition deposition, a chemical vapor deposition (CVD) process on at least one side of the metal substrate. For example, a rapid thermal chemical vapor deposition (RTCVD), inductively coupled plasma-chemical vapor deposition (ICP-CVD), low pressure chemical vapor deposition (LPCVD), atmospheric pressure chemical vapor deposition (APCVD), metal organic chemical vapor deposition (MOCVD) or plasma-enhanced chemical vapor deposition (PECVD), and the like may be used without limitation. The appropriate conditions for each process are also known.

When the graphene is deposited on the metal substrate, it may be performed at a temperature from 300° C. to a temperature of below the melting point of the metal substrate and under a pressure from $10^{-7}$ milliTorr (mTorr) to the atmospheric pressure. The release film attached to the graphene may include at least one selected from a polymer such as a worm-off tape, polyethylene terephthalate, a polyimide, polyethylene naphthalate, a polycarbonate, and the like, an inorganic material such as glass, silicon wafer and the like, a porous organic-inorganic membrane, a metal organic frame, an ion exchange film, and a membrane electrode. The structure may be formed by a roll-to-roll process. For example, it is formed by laminating a release film on the metal substrate-graphene layer and passing the same through at least one roller or a roller member including a plurality of rollers facing each other, if needed.

When the laminate structure is formed using the roll-to-roll process, the release film may be laminated on the metal substrate-graphene layer by providing a polymer binder film between the metal substrate-graphene layer and the release film to laminate. Alternatively, the release film may be laminated on the metal substrate-graphene layer by heat-treating the release film disposed on the metal substrate-graphene layer. The polymer binder film may include at least one selected from polystyrene, polyethylene, glycol, poly (methylmethacrylate), polyvinylpyrrolidone, Nafion™, sodium poly(acrylate), poly(diallyldimethyl ammonium chloride), and polyethyleneimine. The roller member may be also used to provide the polymer binder film.

The heat treatment may be performed at a temperature of about 60 to about 200° C., for example, at a temperature of about 120 to about 160° C. While not wishing to be bound by theory, it is understood that within the temperature range, the bond between the graphene and the release film may be enhanced by the heat treatment. The laminating may be performed at a room temperature and under the atmospheric pressure. The graphene-release film structure may be obtained by inputting the laminate structure into the etching process and removing the metal substrate.

The obtained graphene-release film structure is attached to displace the graphene layer facing the first layer and then heated to be cured. The heating temperature and the time for the curing are changed depending upon the nature of the copolymer included in the first layer (and, selectively, the nature of the substrate) and may be appropriately selected. For example, when a copolymer of a styrene-based monomer (e.g., styrene, vinylphenol or the like) and an acrylate-based monomer (e.g., alkyl(meth)acrylate or the like) is used as the copolymer, the heating temperature may range from about 120° C. to about 180° C., for example, from about 130° C. to about 160° C., but is not limited thereto.

The heating atmosphere is not particularly limited, but the heating may be performed under the inert atmosphere or under vacuum.

After disposing a second layer including graphene or a derivative thereof directly on the first layer, the release film may be selectively removed. The removing of a release film may be appropriately performed according to the nature of the release film, but is not particularly limited. For example, the release film may be removed by using a solvent such as ethanol or taping (i.e., adhesive tape having appropriate adherence is applied and then removed), but is not limited thereto. In the transparent electrode according to an embodiment, the release film may be removed by a simple taping, since the binding force between the first layer and the second layer is improved.

A thickness of the second layer is not particularly limited, and may be appropriately selected. For example, the second layer may have a thickness of greater than or equal to a thickness of a single layer of graphene, but is not limited thereto. For example, the second layer may have a thickness of less than or equal to a thickness of about 6 layers of graphene, at a maximum, but is not limited thereto.

A third layer including an electrically conductive metal nanowire is disposed on the second layer. In other words, it has a structure in which two conductive layers are connected in parallel. The electrically conductive metal may include silver (Ag), copper (Cu), gold (Au), aluminum (Al), cobalt (Co), palladium (Pd), or a combination thereof (e.g., an alloy thereof, or nanometal wire having greater than or equal to 2 segments). For example, the electrically conductive metal nanowire may be a silver nanowire.

The conductive nanowire-included electrical conductor often has unfavorable visibility since the incident light is specularly reflected and diffusely reflected. However, in the transparent electrode according to an embodiment including a third layer disposed on the second layer, the diffuse reflection is occurred to a lesser extent, so the visibility may be improved.

The electrically conductive metal nanowire may have an average diameter of less than or equal to about 50 nm, for example, less than or equal to about 40 nm, or less than or equal to about 30 nm. The length of electrically conductive metal nanowire is not particularly limited, but may be appropriately selected according to a desired diameter. For example, the electrically conductive metal nanowire may have a length of greater than or equal to about 1 µm, greater than or equal to about 2 µm, greater than or equal to about 3 µm, greater than or equal to about 4 µm, greater than or equal to about 5 µm, but is not limited thereto. According to another embodiment, the electrically conductive metal nanowire may have a length of greater than or equal to about 10 µm, for example, greater than or equal to about 11 µm, greater than or equal to about 12 µm, greater than or equal to about 13 µm, greater than or equal to about 14 µm, or greater than or equal to about 15 µm. The electrically conductive metal nanowire may be fabricated according to the known method or may be commercially available. The nanowire may include a polymer coating such as polyvinylpyrrolidone disposed on its surface.

The third layer may be formed by the known method of forming a layer, and is not particularly limited. According to a non-limiting example, the third layer may be formed by applying an appropriate coating composition including an electrically conductive metal nanowire on the second layer and removing a solvent. The coating composition may further include an appropriate solvent (e.g., water, organic solvent miscible or non-miscible with water, and the like) and a dispersing agent (e.g., hydroxypropylmethyl cellulose (HPMC), a C2 to C20 organic acid).

For example, the ink composition including the electrically conductive metal nanowire may be commercially available or may be prepared according to the known method. For example, the ink composition may have the composition shown in Table 1, but is not limited thereto.

TABLE 1

| | Materials | Amount |
|---|---|---|
| Electrically conductive metal | Electrically conductive metal (e.g. Ag) nanowire aqueous solution (concentration: 0.001-10.0 wt %) | 5-40% |
| Solvent | Water | 20-70% |
| | Alcohol (ethanol) | 10-50% |
| Dispersing agent or binder | Hydroxypropylmethyl cellulose aqueous solution (0.05-5 wt %) | 1-10% |

The composition is coated on a substrate (or selectively, preliminarily formed as the first or second conductive layer) and, selectively, dried and/or heat-treated to provide a conductive layer. For example, coating of the composition may be performed by various methods, for example, bar coating, blade coating, slot die coating, spray coating, spin coating, gravure coating, ink jet printing, or a combination thereof.

The third layer may include an organic binder to bind nanowires. The binder may control a viscosity of a composition for forming a conductive layer or increase binding forces of the nanowires on a substrate. Non-limiting examples of the binder may include methyl cellulose, ethyl cellulose, hydroxypropyl methyl cellulose (HPMC), hydroxypropyl cellulose (HPC), a xanthan gum, polyvinyl alcohol (PVA), polyvinyl pyrrolidone (PVP), carboxymethyl cellulose, hydroxyethyl cellulose, or a combination thereof. An amount of the binder may be appropriately selected and is not particularly limited. In non-limiting examples, an amount of the binder may be about 1 to about 100 parts by weight based on 100 parts by weight of the nanowire.

The thickness of the third layer may be appropriately selected considering the desirable conductivity and light transmittance of the transparent electrode, and the like, but is not particularly limited.

As described above, the transparent electrode may further include an overcoating layer (OCL) including a thermosetting resin, an ultraviolet (UV) curable resin, or a combination thereof disposed on the third layer. Specific examples of the thermosetting resin and the ultraviolet (UV) curable resin for the OCL are known. In an embodiment, the thermosetting resin and the ultraviolet (UV) curable resin for an overcoating layer (OCL) may be urethane (meth)acrylate, a perfluoropolymer having a (meth)acrylate group, a poly (meth)acrylate having a (meth)acrylate group, an epoxy (meth)acrylate, or a combination thereof. The overcoating layer may further include an inorganic oxide particulate (e.g., silica particulate). The method of forming the OCL from the above-mentioned materials is also known, and is not particularly limited.

The transparent electrode according to an embodiment may have an improved flexibility as well as an improved electrical conductivity, a satisfactory light transmittance, and an improved visibility. The transparent electrode may have a transmittance of greater than or equal to about 85%, for example, greater than or equal to about 86%, greater than or equal to about 87%, or greater than or equal to about 88% (e.g., about 89% to about 90%) with respect to light having a wavelength of 550 nm; a sheet resistance of less than or equal to about 200 ohms per square ($\Omega$/sq), for example, less than or equal to about 100 $\Omega$/sq, less than or equal to about 90 $\Omega$/sq, less than or equal to about 80 $\Omega$/sq, less than or equal to about 70 $\Omega$/sq, or less than or equal to about 60 $\Omega$/sq (e.g., about 32 to about 34 $\Omega$/sq). The transparent electrode may have a haze of less than or equal to about 1.2%, for example, from about 0.8 to about 1.1%. The transparent electrode (reference sheet resistance of 40 $\Omega$/sq) may have a diffuse reflection (DR) of less than or equal to about 7.6, for example, less than or equal to about 7.4, less than or equal to about 7.2 in the light wavelength of about 360 to 740 nm.

In another embodiment, a method of manufacturing the transparent electrode includes:

forming a first layer including a thermosetting copolymer including a first repeating unit having an aromatic moiety as a pendant group or incorporated in a backbone of the copolymer and a second repeating unit capable of lowering a curing temperature, a combination of a first polymer including the first repeating unit and a second polymer including the second repeating unit, or a combination thereof, on a substrate;

forming a second layer including graphene disposed on a release film;

contacting the second layer with the first layer facing each other followed by curing the contacted first and second layers to provide a laminate structure; and forming a third layer including an electrically conductive metal nanowire on the second layer.

The method may further include removing the release film from the second layer of the laminate structure to expose the surface of the second layer as needed.

The compositions of the first layer, the second layer, the third layer and the specific method of forming the layers are the same as described above.

Figure 2:
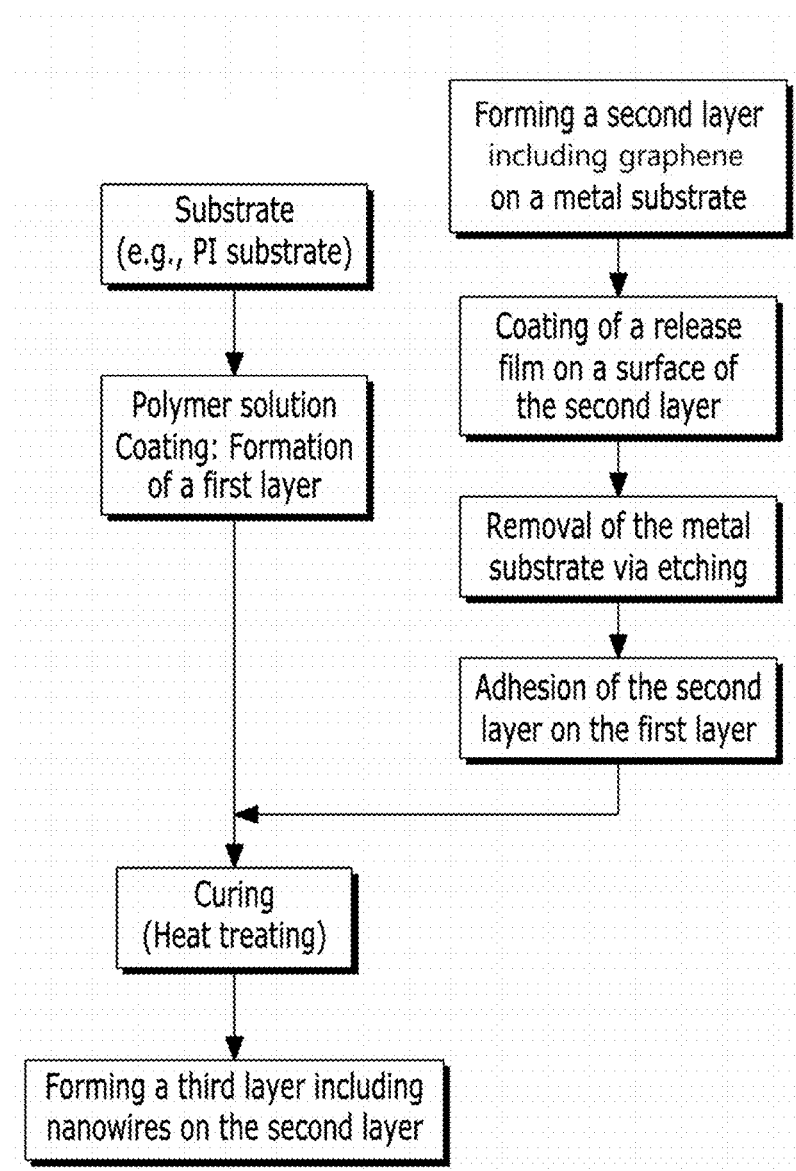
FIG. 2 is a flowchart showing a method of manufacturing a transparent electrode in a non-limiting embodiment.

As the non-limiting example, the method is illustrated in FIG. 2. The copolymer-containing solution is coated on the substrate to provide a first layer. The graphene-release film structure is prepared, and the graphene surface of the second layer and the surface of the first layer are bonded and cured. Selectively, after removing the release film, a third layer including conductive nanowire is formed on the second layer (by, for example, bar coating, spin coating, etc.). Selectively, an overcoating layer is formed on the third layer.

In another embodiment, an electronic device includes the transparent electrode.

The electronic device may be a flat panel display, a touch screen panel, a solar cell, an e-window, an electrochromic mirror, a heat mirror, a transparent transistor, or a flexible display.

Figure 3B:
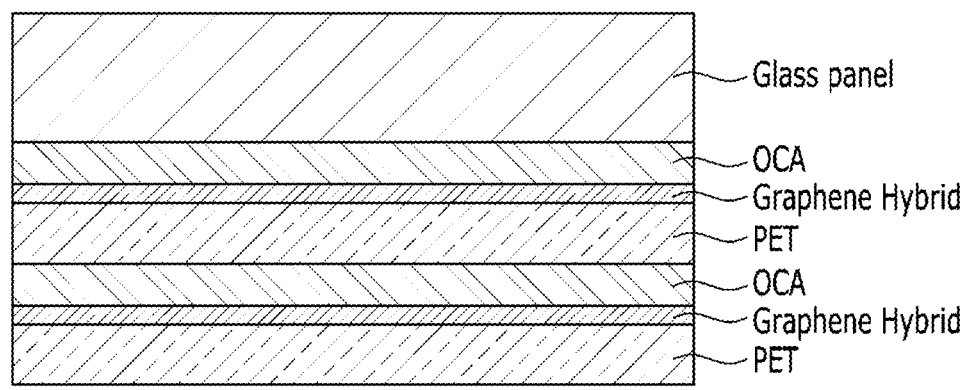
FIG. 3B is a schematic view showing a cross-section of an electronic device (touch screen panel) according to another embodiment.

In an exemplary embodiment, the electronic device may be a touch screen panel (TSP). The detailed structure of the touch screen panel is well known. The schematic structure of the touch screen panel is shown in FIGS. 3A and 3B. Referring to FIG. 3A, the touch screen panel may include a first transparent conductive film, a first transparent adhesive film (e.g., an optically clear adhesive (OCA)) film, a second transparent conductive film, a second transparent adhesive film, and a window for a display device, disposed on a panel for a display device (e.g., an LCD panel). The first transparent conductive layer and/or the second transparent conductive layer may be the transparent electrode. Referring to FIG. 3B, the touch screen panel may have a structure of substrate-graphene-containing hybrid structure-OCA-substrate-graphene-containing hybrid structure-OCA-glass panel.

In addition, an example of applying the transparent electrode to a touch screen panel (e.g., a transparent electrode of TSP) is illustrated, but the conductor may be used as an electrode for other electronic devices including a transparent electrode without a particular limit. For example, the conductor may be applied as a pixel electrode and/or a common electrode for a liquid crystal display (LCD), an anode and/or a cathode for an organic light emitting diode device, or a display electrode for a plasma display device.

Hereinafter, the embodiments are illustrated in more detail with reference to examples. These examples, however, are not in any sense to be interpreted as limiting the scope of this disclosure.

EXAMPLES

Measurement:

[1] Measurement of sheet resistance: Sheet resistance is measured as follows.

Measurer: Mitsubishi loresta-GP (MCP-T610), ESP-type probes (MCP-TP08P)

Sample size: width 8 centimeters (cm)×length 8 cm

Measurement: average after repeating the measurement at least 9 times

[2] Light transmittance measurement: Light transmittance is measured as follows.

Measurer: NIPPON DENSHOKU INDUSTRIES (NDH-7000 SP)

Sample size: width 8 cm×length 8 cm

Sample Measurement: average after repeating the measurement at least 9 times

[3] Haze Measurement: Haze is measured as follows.

Measurer: NIPPON DENSHOKU INDUSTRIES (NDH-7000 SP)

Sample size: width 8 cm×length 8 cm

Sample Measurement: average after repeating the measurement at least 9 times

[4] Scanning Electron Microscope (SEM): Scanning electron microscopic analysis is performed by the following devices.

Electron microscope: FE-SEM (Field Emission Scanning Electron Microscopy) Hitachi (SU-8030)

[5] TOF-SIMS analysis: Time of flight secondary mass spectrometry analysis is performed by the following devices.

Measurer: Time-of-flight secondary ion mass spectrometer (product name: TOF-SIMS IV, manufacturer: German Ion TOF GmbH)

[6] XPS Analysis: XPS Analysis is performed using the following devices:

Measurer: X-ray photoelectron spectroscopy (measurer: ULVAC-PHI product name: Quantera II)

[7] Diffuse reflection (DR) measurement: Diffuse reflection is measured as follows:

Konica Minolta Spectrophotometer (CM-3600d) is used. The DR value of transparent electrode is changed according to the sheet resistance, which fixed at 40 ohms per square (ohm/sq). The coated layer is disposed on the device to be reflected, and then the DR is measured within a wavelength region of 360-740 nanometers (nm).

Reference Example 1: Preparation of Graphene-Release Film Structure

A graphene layer is deposited on one surface of copper substrate by a low pressure chemical vapor deposition (CVD), and a polymethylmethacrylate film is coated on the graphene layer and cured. The obtained resulting product is copper-etched using $FeCl_3$ or ammonium persulfate as a Cu etchant to provide a graphene-release film structure.

Example 1

Polyvinylphenol-polymethylmethacrylate copolymer (manufacturer: Sigma Aldrich, product name: pvp-co-pmma Poly(4-vinylphenol-co-methyl methacrylate), weight average molecular weight (Mw): 8,000-12,000 Da) is dissolved in a mixed solvent of DAA:IPA (5:5) to provide a solution having 3.0 percent by weight (wt %) of a solid. The solution is coated on a PET substrate according to a bar coating method to provide a first layer having a thickness of 200 nm.

The formed first layer surface is disposed to be contacted with the graphene layer of the structure obtained from Reference Example 1 and heat-treated under the vacuum at a temperature of 150° C. to bind the first layer with the second layer. The release film is removed from the resultant product according to a taping method to expose the second layer surface (i.e., the graphene layer).

Figure 9:
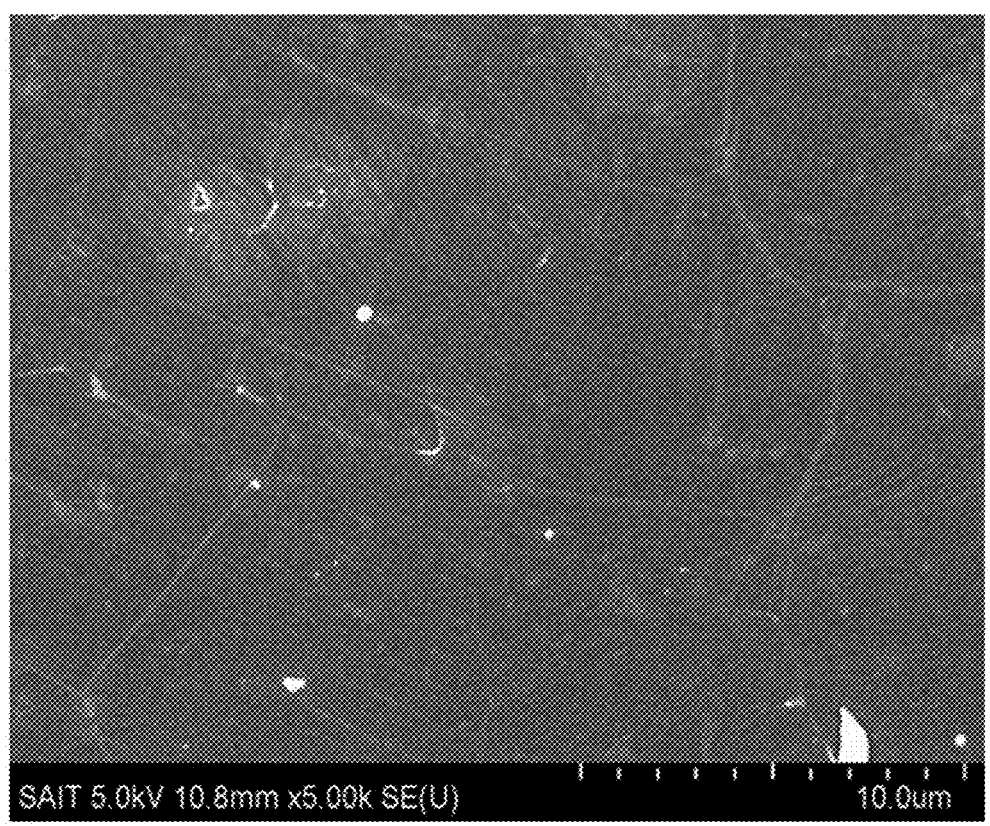
FIG. 9 is an optical microscope image of surface after taping the graphene layer obtained from Example 1.

The sheet resistance of the second layer surface is measured, and the results are shown in Table 2:

An adhesive tape (manufacturer: Dow Corning, product name: PSA) is applied on the surface of the graphene layer and then removed. The resultant results are shown in FIG. 9. The sheet resistance of the second layer surface is measured after applying the adhesive tape and removing the same, and the results are shown in Table 2.

Example 2

A structure of a PET substrate-first layer of the copolymer-second layer of graphene is obtained in accordance with the same procedure as in Example 1, except that the solution including polyvinyl phenol-polymethylmethacrylate copolymer has 1.5 wt % of solid.

A thickness of the first layer, a sheet resistance of the second layer surface, and a sheet resistance after applying an adhesive tape and removing the same are each measured, and the results are shown in Table 2.

Comparative Example 1

A PET-graphene structure is obtained in accordance with the same procedure as in Example 1, except that the first layer is not used.

Figure 4:
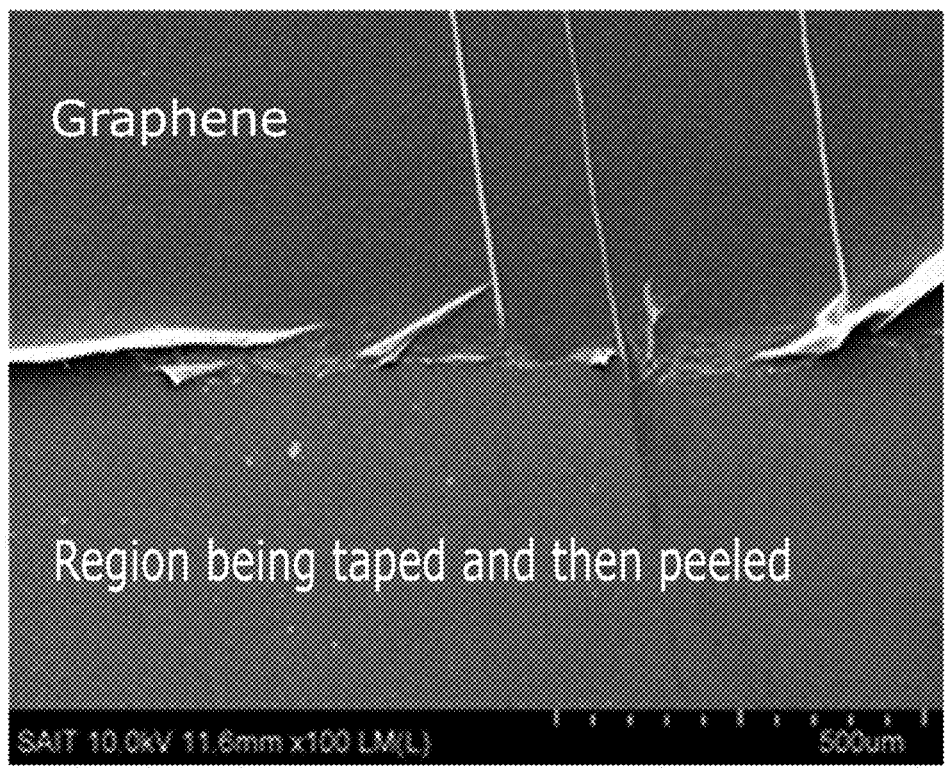
FIG. 4 is an optical microscope image of surface after taping the graphene layer obtained from Comparative Example 1.

An adhesive tape (manufacturer: 3M, product name: Scotch) is applied on the surface of the graphene layer and then removed, and the photograph thereof is shown in FIG. 4. From the results of FIG. 4, it is determined that all of the graphene layer is peeled off by the adhesive tape test when the first layer is not present.

Comparative Examples 2 to 6

A structure of PET substrate-first layer of the copolymer-second layer of graphene is obtained in accordance with the same procedure as in Example 1, except that a mixture of polyvinyl phenol (PVP) and poly(melamine-formaldehyde) (PMF/PVP=1:1.76) or polysiloxane is included in the amounts shown in the following Table 2, instead of the polyvinyl phenol-polymethylmethacrylate copolymer.

A thickness of the first layer, a sheet resistance of the second layer surface, and a sheet resistance after applying an adhesive tape and removing the same are each measured, and the results are shown in Table 2.

a temperature of about 200° C., so it is practically useful to perform the heat treatment at a temperature of about 150° C. which is lower than the temperature of 200° C.

In addition, as the thickness of the organic material layer (the first layer) becomes higher (in other words, as the solid content of the solution is getting higher), the light transmittance of the entire structure may be decreased. For example, although the light transmittance is not significantly affected after the OC (refractive index 1.6) coating to a 100 nm thickness of the first layer, the light transmittance is decreased by 1-2% when the first layer has a thickness of 300 nm (PVP+PMF), compared to Example 2, so it is preferable to use PVP-co-PMMA, also in the view of the light transmittance change.

Example 3

A structure of PET substrate-first layer of the copolymer-second layer of graphene is obtained in accordance with the same procedure as in Example 1.

The obtained structure is analyzed by TOF-SIMS and XPS before and after applying an adhesive tape (manufacturer: 3M, Product Name: Scotch) on the surface of the graphene layer, and the results are shown in FIG. 5A (before taping) and FIG. 5B (after taping) and FIG. 6, respectively.

Figure 5A:
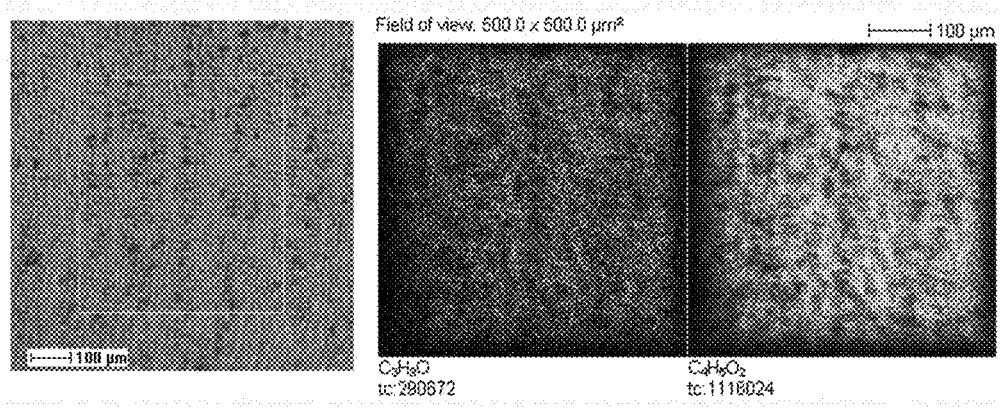
FIG. 5A and FIG. 5B are images showing the TOF-SIMS results of Example 3.
Figure 5B:
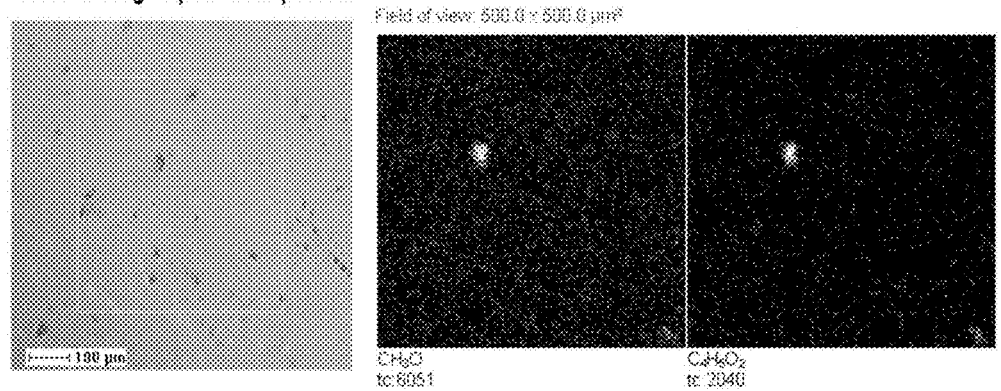
Figure 6:
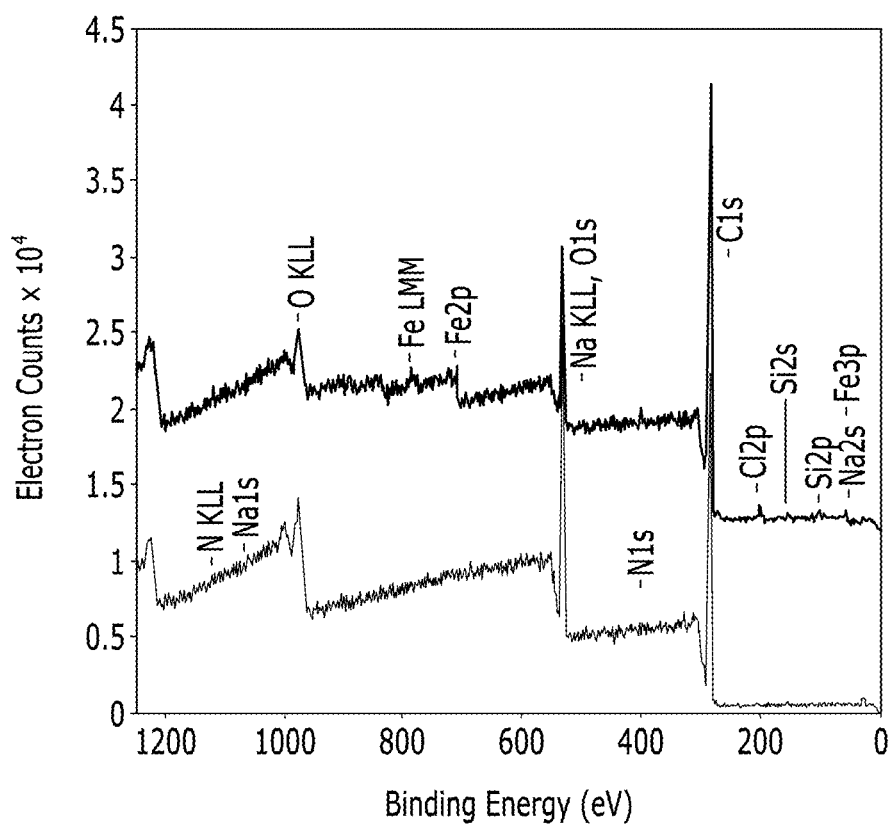
FIG. 6 is a graph of electron counts $\times 10^4$ versus binding energy, showing the XPS results of Example 3.

The PMMA related components ($C_3H_3O$, $C_4H_5O_2$), can be observed in FIG. 5A, but are not found in FIG. 5B. In

TABLE 2

|  | First layer composition (solid content in solution), heat treatment temperature and time | Sheet resistance before taping | Sheet resistance after taping | Resistance change rate after taping (%) | Thickness of the first layer |
|---|---|---|---|---|---|
| Example 1 | PVP-co-PMMA (1.5%) 150° C. and 2 hours | 770 | 1,300 | 69% | 50 |
| Example 2 | PVP-co-PMMA (3.0%) 150° C. and 2 hours | 580 | 900 | 55% | 100 |
| Comparative Example 1 | PVP + PMF 10% 150° C. and 2 hours | 680 | 32,000 | 4,600% | 300 |
| Comparative Example 2 | PVP + PMF (3.0%) 200° C. and 2 hours | 630 | 25,800 | 4,000% | 100 |
| Comparative Example 3 | PVP + PMF 5% 200° C. and 2 hours | 660 | 1,650 | 150% | 150 |
| Comparative Example 4 | PVP + PMF 10% 200° C. and 2 hours | 610 | 1,067 | 75% | 300 |
| Comparative Example 5 | PVP + PMF 15% 200° C. and 2 hours | 675 | 1,590 | 135% | 500 |
| Comparative Example 6 | siloxane 10% 200° C. and 2 hours | 550 | 11,000 | 1,900% | 300 |

From the results of Table 2, it is determined that the structures obtained from Example 1 and Example 2 may ensure excellent adherence for graphene even when the first layer has a low thickness, so as to provide a remarkably low sheet resistance increase rate in the taping test. The structure of Comparative Example 1 is cured under the same curing conditions as the structure of Example 1, but it has a significantly high resistance variation ratio. It is suggested that the first layer of structure according to Comparative Example 1 has unfavorable adherence for graphene. Almost transparent polymer substrates may be deformed or deteriorated (e.g., optical properties of the substrates may be deteriorated) by a high temperature when it is heat-treated at FIG. 6, the below graph shows the XPS results before taping; and the above graph shows the XPS results after a tape is applied and subsequently removed. From FIG. 6, it can be seen that the O 1s peak is significantly decreased after a tape is applied and subsequently removed.

From the TOF-SIMS analysis and XPS analysis results, it is determined that the structure including the first layer according to Example has excellent adherence between graphene and the first layer, which is enough to remove a release film component (i.e., polymethylmethacrylate) present on the graphene surface by the taping test of the graphene layer.

Example 4

A structure of PET substrate-first layer of the copolymer-second layer of graphene is obtained in accordance with the same procedure as described in Example 1, except that an additive is added to the same solution for the first layer as prepared in Example 1 and shown in the following Table 3.

After the curing, the sheet resistance of the second layer surface is measured, and the results are shown in Table 3.

TABLE 3

| Additive (use amount) | No additive | Zinc acetate (5% of solid content) | Tin acetate (5% of solid content) | Benzyl amine (5% of solid content) |
| --- | --- | --- | --- | --- |
| Sheet resistance after curing (ohm/sq) | 825 | 450 | 480 | 760 |

From the results of Table 3, it is determined that the sheet resistance of the graphene layer is significantly decreased by addition of the additive. Without being bound by any particular theory, the addition of an additive to the first layer may provide p-doping or n-doping effects to graphene, which may contribute to the conductivity increase and the sheet resistance decrease.

Example 5

[1] Obtaining a silver nanowire-contained composition having the following components:
  4.8 g of nanowire aqueous solution (concentration: 0.5 wt %, silver nanowire having an average diameter of 30 nm)
    solvent: 8.1 g of water and 4.7 g of ethanol
    binder: 1.1 g of hydroxypropyl methyl cellulose aqueous solution (concentration: 0.25%)

The nanowire-contained composition is bar-coated on the second layer and dried at 85° C. for 1 minute.

[2] The conductor obtained from [1] is fixed on a flat bottom, coated with urethane acrylate using a wired bar, and dried at a room temperature for one minute or longer. Subsequently, when the obtained resulting material is dried in an oven at 100° C. for 3 minutes and irradiated again with a UV lamp (wavelength: 365 nm, light quantity: 800 milli-Joules per square centimeter, $mJ/cm^2$) for 15 seconds, an overcoating layer is formed by a cross-linking polymerization between acrylate to provide a transparent electrode.

[3] The sheet resistance, transmittance, haze, and diffuse reflection (DR) of the obtained transparent electrode is measured. The results show that the sheet resistance is 32 ohms per square (ohm/sq), the transmittance is 89%, the haze is 1.2%, and the diffuse reflection (DR) is 7.1.

Example 6

A structure of PET substrate-first layer of the copolymer-second layer of graphene is obtained in accordance with the same procedure as described in Example 1 and Example 2, except that the solvent for the solution for a first layer is DAA:IPA (5:5). When the solvent is a mixed solvent of DAA and IPA, the wetting property is improved; so it is determined that the resistance change rate is 55% when using a solution having 1.5% of solid, and the resistance change rate is 45% when using a solution having 3.0% of solid. This is value is lower than the values of 69% of Example 1 (solid 1.5%) and 55% of Example 2 (solid 3.0%).

Comparative Example 7

The silver nanowire composition obtained from Example 5 is coated on the PET substrate to provide a silver nanowire layer, and an overcoating layer is formed on the silver nanowire layer in accordance with the same procedure as described in Example 5 to provide a transparent electrode having a PET substrate-Ag nanowire-OCL structure.

The sheet resistance, transmittance, haze, and diffuse reflection (DR) of the obtained transparent electrode is measured. The results show that the sheet resistance is 35 ohm/sq; the transmittance is 89%; the haze is 1.1%; and the diffuse reflection (DR) is 7.4.

Experimental Example 1: Evaluation of Stability

The transparent electrode obtained from Example 5 and the transparent electrode obtained from Comparative Example 7 are allowed to stand at 85° C./relative humidity of 85% for 10 days, and the surface resistance change rate is measured. The results are shown in the following Table 4.

TABLE 4

| | Resistance change rate after 10 days |
| --- | --- |
| Transparent electrode of Comparative Example 7 | 6.7% |
| Transparent electrode of Example 5 | 3.2% |

From the results of Table 4, it is determined that the transparent electrode (having a hybrid structure) obtained from Example 5 has improved stability compared to the structure including only silver nanowire layer.

Example 9: Evaluation of Flexibility of the Electrical Conductors Having the Hybrid Structure

[1] The flexibility of the electrical conductor having the hybrid structure is evaluated by the calculation of the silver nanowire random network sheet resistance based on the following steps.

The silver nanowire random network is made by randomly designating the central coordinates (x, y) and angle 8 of the wire in the square simulation domain using MATLAB.

For the wires made in the aforementioned manner, it is determined whether they meet another wire in the network using a formula for calculating a distance between two straight lines, and thereby the wire contact information is stored.

A cluster of wires through which the current may flow from the wire contacting the left end of square simulation domain to the wire contacting the right end without stopping is determined using the stored inter-contact information between the wires.

While considering the resistance of Ag NW itself and the contact resistance between the wires for all the wire contact points (junction) in each cluster, a linear equation is established by applying the Kirchhoff current law.

In this case, the linear equation is transformed in order to apply a 2D hybrid, wherein the NW junction deformed by bending is a model flowing through 2D sheet, and the 2D sheet is assumed to have an 100% coverage.

In a delamination model wherein the wire is not cut, it is assumed that some of the inter-wire junctions are spaced, and the current is flowed through the 2D sheet instead of the spaced contact, and thus the contact resistance of the linear equation corresponding to the spaced junction is changed to the 2D sheet resistance.

Figure 7:
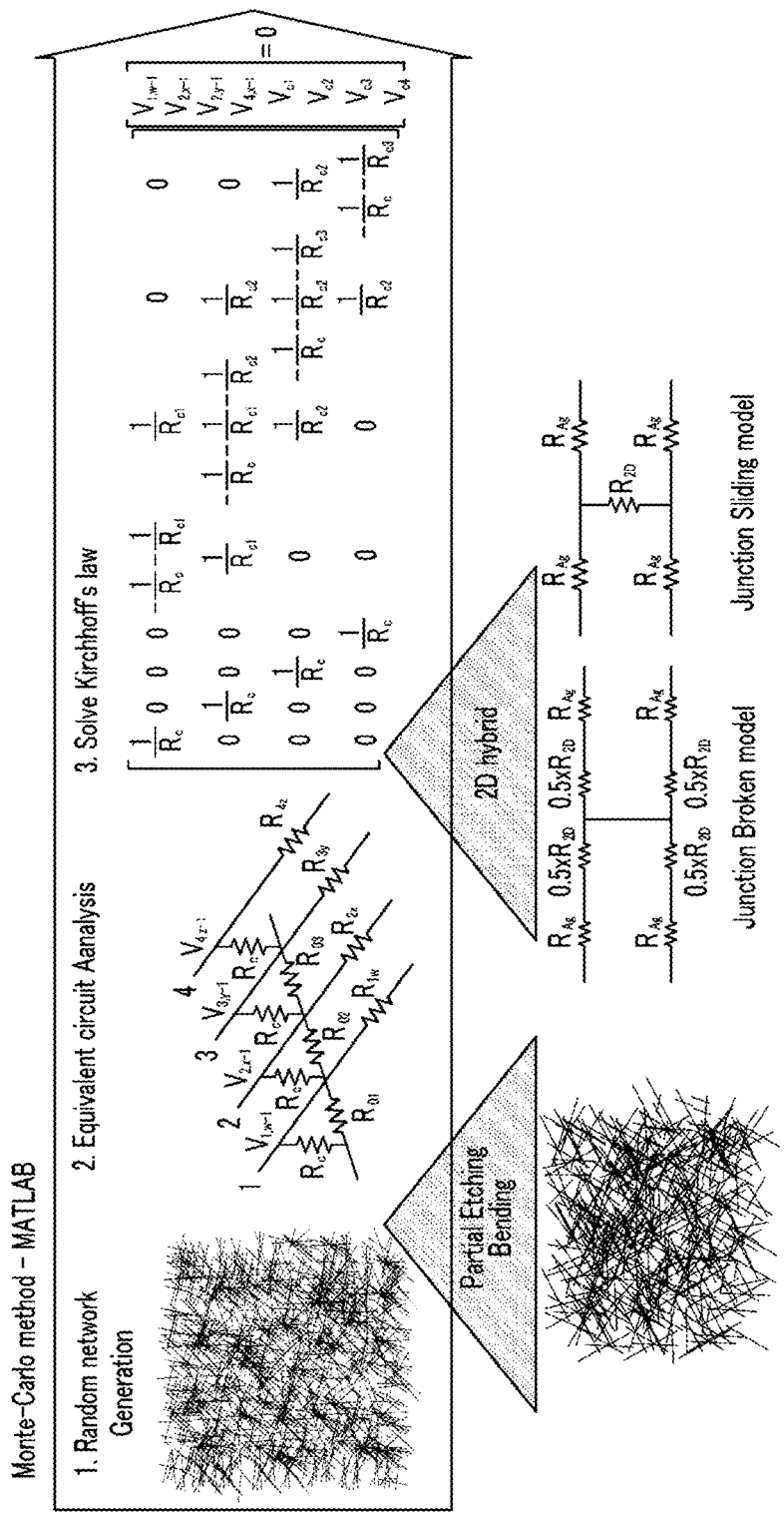
FIG. 7 is a diagram illustrating a bending simulation.

In a broken junction model wherein the wire is cut, the linear equation is transformed by removing the contract resistance of the linear equation corresponding to the broken junction and adding the resistance corresponding to a half of the 2D sheet to the broken wire resistance in series (referring to FIG. 7).

The linear equation is solved as many times as the number of junctions to calculate the value of the current flowing when a 1 Volt (V) voltage is applied from the left to the right of the square simulation domain, and based on this current value, the sheet resistance of the Ag NW network is calculated.

Figure 8:
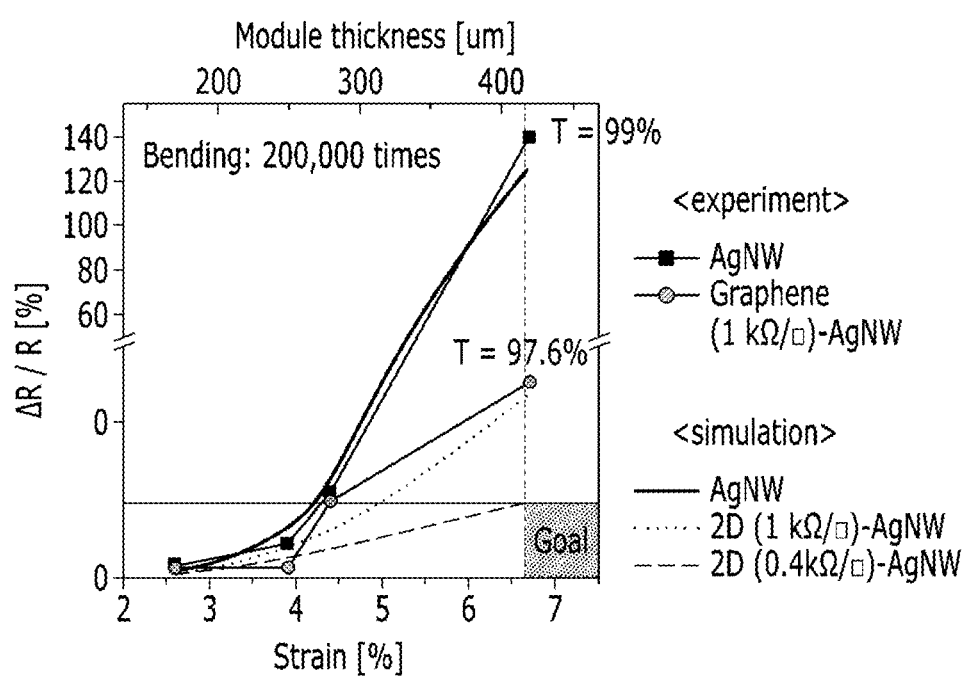
FIG. 8 is a graph of resistance change rate (percent, %) versus module thickness (micrometers, um) and strain (%, percent), which is a view showing the bending simulation results.

[2] From the results of FIG. 8, it is determined that the conductor having a nanowire/nanosheet hybrid structure may show an improved resistance change rate compared to the conductor having only the nanowire, when the 2D nanosheet layer having a predetermined sheet resistance is present.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A transparent electrode comprising:
   a first layer comprising a thermosetting copolymer represented by Chemical Formula 3; wherein the first layer has a first side and a second side opposite to the first side;
   a second layer disposed directly on the first side of the first layer, wherein the second layer consists of graphene;
   a third layer disposed on the second layer, wherein the third layer comprises an electrically conductive metal nanowire; and
   a flexible substrate disposed directly on the second side of the first layer;

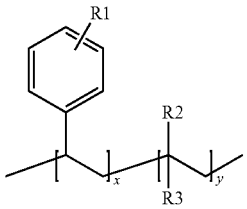

Chemical Formula 3 wherein in Chemical Formula 3,
R1 is a hydroxyl group,
R2 is hydrogen or a C1 to C3 alkyl,
R3 is —COOR$_4$, wherein R$_4$ is a substituted or unsubstituted C1 to C10 alkyl group, and
x and y independently represent the number of respective repeating units.

2. The transparent electrode of claim 1, wherein a thickness of the first layer is less than or equal to about 300 nanometers.

3. The transparent electrode of claim 2, wherein a thickness of the first layer is about 50 nanometers to about 200 nanometers.

4. The transparent electrode of claim 1, wherein the first layer further comprises a zinc-containing compound, a tin-containing compound, a gold-containing compound, an aryl amine, an arylimidazole, a curing agent, a nitric acid, or a combination thereof.

5. The transparent electrode of claim 1, wherein the electrically conductive metal nanowire comprises silver, copper, gold, aluminum, cobalt, palladium, or a combination thereof.

6. The transparent electrode of claim 1, wherein the electrically conductive metal nanowire has an average diameter of less than or equal to about 50 nanometers and an average length of greater than or equal to about 1 micrometer.

7. The transparent electrode of claim 1, wherein the transparent electrode further comprises an overcoating layer disposed directly on the second layer,
   wherein the overcoating layer comprises: the thermosetting copolymer, a combination of the first polymer and the second polymer, a urethane (meth)acrylate, a perfluoropolymer comprising a (meth)acrylate group, a poly(meth)acrylate comprising a (meth)acrylate group, an epoxy(meth)acrylate, or a combination thereof.

8. The transparent electrode of claim 1, wherein the transparent electrode further comprises an overcoating layer comprising a polymer disposed on the third layer.

9. The transparent electrode of claim 8, wherein the overcoating layer comprises the thermosetting copolymer, the combination of the first polymer and the second polymer, a urethane (meth)acrylate, a perfluoropolymer comprising a (meth)acrylate group, a poly(meth)acrylate comprising a (meth)acrylate group, an epoxy(meth)acrylate, or a combination thereof.

10. The transparent electrode of claim 1, wherein the transparent electrode has light transmittance of greater than or equal to about 85% at a wavelength of 550 nanometers and sheet resistance of less than or equal to about 200 ohms per square.

11. An electronic device comprising the transparent electrode of claim 1.

12. The electronic device of claim 11, wherein the electronic device is a flat panel display, a touch screen panel, a solar cell, an e-window, an electrochromic mirror, a heat mirror, a transparent transistor, or a flexible display.

* * * * *